United States Patent
Tsubouchi et al.

Patent Number: 5,602,424
Date of Patent: Feb. 11, 1997

[54] SEMICONDUCTOR CIRCUIT DEVICE WIRING WITH F.C.C. STRUCTURE, PLANE ORIENTION (100) AND ALIGNED WITH THE CURRENT DIRECTION

[76] Inventors: Kazuo Tsubouchi, 30-38, Hitokita 2-chome, Taihaku-ku, Sendai-shi, Miyagi-ken; Tadahiro Ohmi, 1-17-301, Komegafukuro 2-chome, Aoba-ku, Sendai-shi, Miyagi-ken; Yohei Hiura, 14-10-345, Shinkoyasu 2-chome, Kanagawa-ku, Yokohama-shi, Kanagawa-ken; Kazuya Masu, 3-3-201, Mikamine 1-chome, Taihaku-ku, Sendai-shi, Miyagi-ken, all of Japan

[21] Appl. No.: 182,389

[22] Filed: Jan. 18, 1994

Related U.S. Application Data

[63] Continuation of Ser. No. 872,051, Apr. 22, 1992, abandoned.

[30] Foreign Application Priority Data

Apr. 25, 1991 [JP] Japan ................... 3-095558

[51] Int. Cl.$^6$ ................. H01L 29/417
[52] U.S. Cl. ............... 257/771; 257/255; 257/773
[58] Field of Search .................. 257/771, 255, 257/773

[56] References Cited

U.S. PATENT DOCUMENTS 4,439,752  3/1984  Starr ............................ 338/2
5,187,561  2/1993  Hasunuma et al. ............ 257/771

FOREIGN PATENT DOCUMENTS 0407133  1/1991  European Pat. Off. .

OTHER PUBLICATIONS

K. Tsubouchi et al., "Development of Scanning μ–RHEED Microscopy for Microscopy for Imaging Polycrystal Grain Structure in LSI," *Japanese Journal of Applied Physics*, vol. 28, No. 11, Nov., 1989, pp. L2075–L2077.

Primary Examiner—Jerome Jackson, Jr.
Attorney, Agent, or Firm— Fitzpatrick, Cella, Harper & Scinto

[57] ABSTRACT

A semiconductor circuit device wiring is provided in which the wiring connected to a semiconductor element is composed of a crystalline material. The crystal axis direction along which nearest neighboring atoms in a single crystal constituting the crystalline material are arranged and the electric current direction through the wiring are crossed with each other at an angle of 22.5° or less.

3 Claims, 8 Drawing Sheets

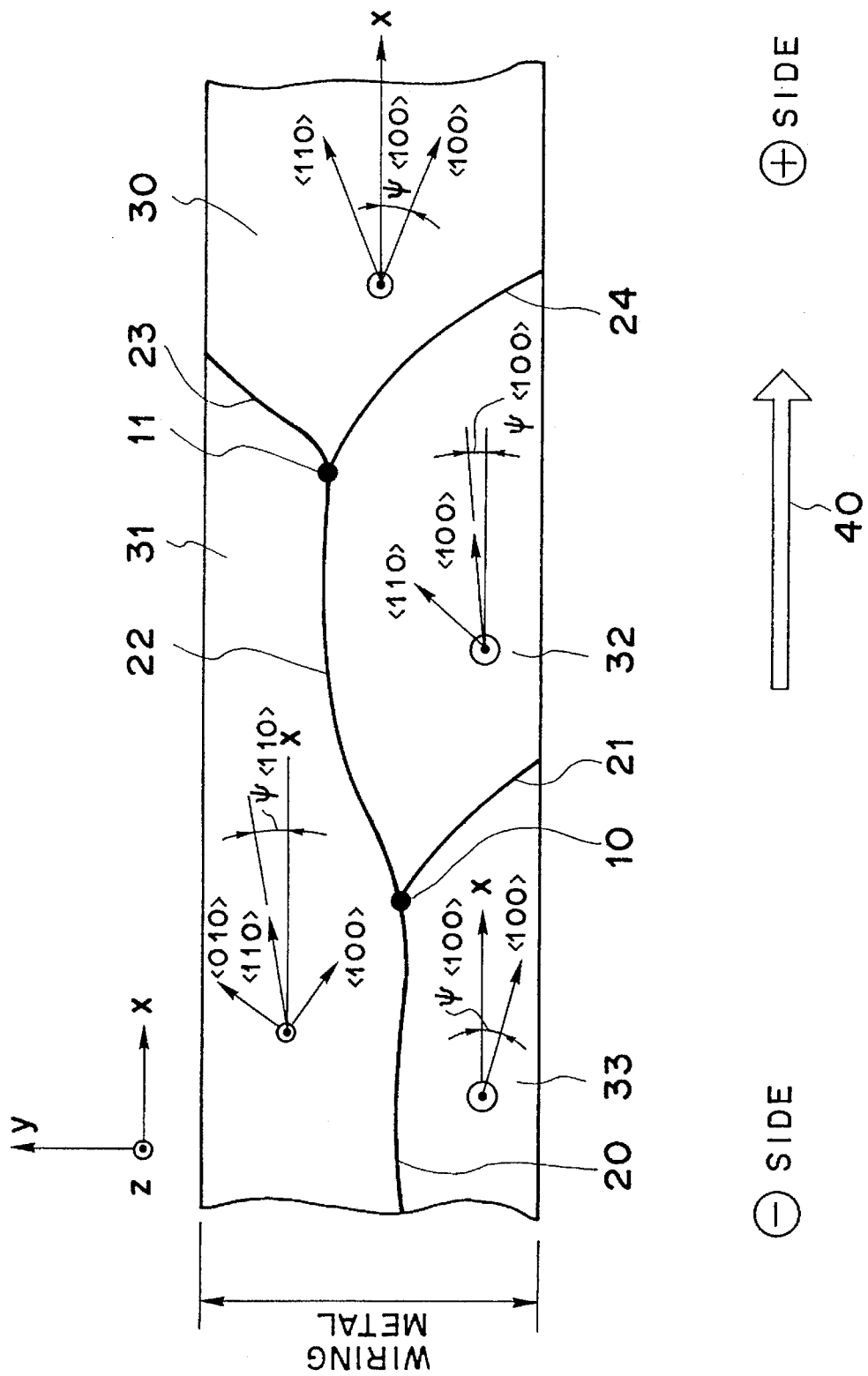

SEMICONDUCTOR CIRCUIT DEVICE WIRING WITH F.C.C. STRUCTURE, PLANE ORIENTION (100) AND ALIGNED WITH THE CURRENT DIRECTION

This application is a continuation of application Ser. No. 07/872,051 filed Apr. 22, 1992, now abandoned.

BACKGROUND OF THE INVENTION

1. Field of the Invention

The present invention relates to a semiconductor circuit device such as LSI which is mounted on an electronic equipment such as a computer, and more particularly to a wiring thereof.

2. Related Background Art

The wiring metal for LSI may be commonly a metal containing Al as the main component or pure Al, or a metal containing Al as the main component and a slight amount of Si or Cu. To meet the demand of faster speed and a higher density, the film thickness and the line width of the Al wiring have been reduced. However, the breaking of wire due to the electric current flow, or the disconnection failure due to a so-called electro-migration, or a so-called stress migration due to being subjected to a high temperature, may reduce the reliability of the Al wiring, making it difficult to make a minute structure.

The wiring metal is crystallographically polycrystalline. Conventionally, with such an Al wiring, it has been known that the disconnection failure due to the electro-migration may be caused by the occurrence of voids or hillocks at a grain boundary of each crystal grain, or the occurrence of voids or hillocks within a crystal grain. Also, regarding a polycrystal Al wiring, there is a report that the electromigration resistance (thereinafter referred to as the EM resistance) of a {111} oriented Al is superior to a {100} oriented polycrystal.

However, the {111} oriented polycrystal and {100} oriented polycrystal only have a lattice plane parallel to a wiring metal surface which is {111} or {100} plane. Thus, voids or hillocks often occurred if the wiring was formed using a polycrystal Al film. Although there is a report that a single crystal Al has been preferably used as the wiring, the EM resistance was often not as excellent as expected.

Thus, the present inventors have found a causal relation between the current flow direction and the void or hillock arising positions, and a qualitative relation between the current direction and the crystal axis. This came about as a result of analyzing a crystal structure of an electrically conductive thin film composed of a crystalline material consisting of a polycrystal or single crystal with a special measuring method.

The above measuring method is a simple evaluation method which allows for a nondestructive measurement of how the plane parallel to a wiring surface and the plane perpendicular thereto are directed with respect to the crystal axis of crystal grain of a polycrystal thin film, using a scan-type μ-RHEED microscope. In Japanese Journal of Applied Physics 29 (1989) L2075, is described the scan-type μ-RHEED microscope.

SUMMARY OF THE INVENTION

A main object of the present invention is to provide a semiconductor circuit device wiring and a semiconductor circuit device having a structure capable of fabricating the superior wiring in migration resistance than the conventional one, with a good yield.

Another object of the present invention is to provide a semiconductor circuit device wiring in which the wiring connected to a semiconductor element is composed of a crystalline material, characterized in that the crystal axis direction in which the nearest neighboring atoms in a single crystal constituting said crystalline material are arranged and the electric current direction flowing in said wiring cross each other at an angle of 22.5° or less.

Further, another object of the present invention is to provide a semiconductor circuit device having a semiconductor element and a wiring made of a crystalline material and connected to said semiconductor element, characterized in that said wiring has first and second wiring portions having different current flow directions and intersecting each other at right angles, and in each of said first and second wiring portions, the crystal axis direction in which nearest neighboring atoms in a single crystal constituting said first and second wiring portions are arranged and the electric current direction flowing in said first and second wiring portions cross each other at an angle of 22.5° or less.

BRIEF DESCRIPTION OF THE DRAWINGS

FIG. 1 is a view for explaining the crystal axis of each crystal grain in a wiring metal.

DETAILED DESCRIPTION OF THE PREFERRED EMBODIMENTS

Figure 2A:
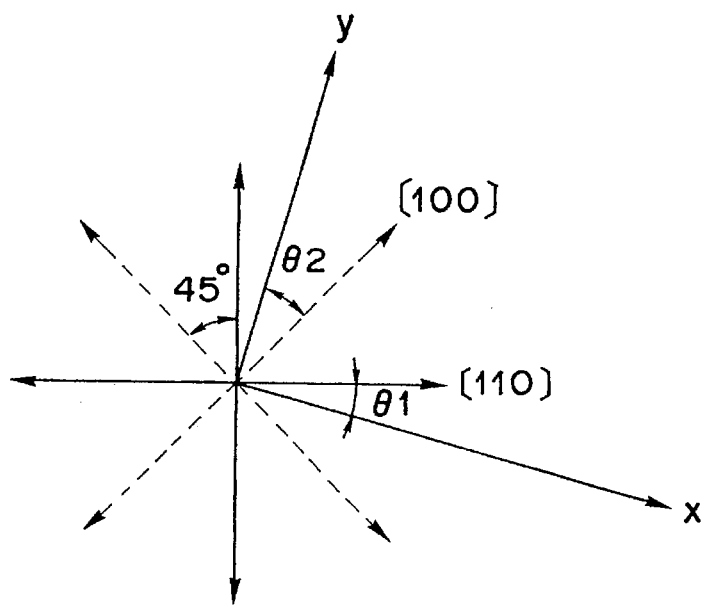
FIGS. 2A to 2C are views showing the crystal axis directions lying in {100} plane {111} plane and {110} plane.

The present invention is to form a wiring pattern so that the current flow direction in a wiring is the same as a crystal axis direction for the arrangement of nearest neighboring atoms in atoms mainly constituting the wiring, or crossed at an angle of 22.5° or less.

The mutual relation discovered by the present inventors will be described before the disclosure of each embodiment.

The inventors have found a crystal axis direction excellent in the EM resistance which can provide a wiring forming method excellent in the EM resistance in an LSI wiring.

Generally, it is believed that if the current flows in the wiring, metal atoms are moved with the flow of electrons, causing voids, and forming hillocks on the positive electrode side of the voids. When the occurrence of voids or hillocks is great, the breaking of wire may be caused. The voids or hillocks are liable to occur at the crystal grain boundary, which is referred to as a "grain boundary diffusion". Also, the voids or hillocks occur not only at the crystal grain boundary, but also within the crystal grain, and their occurrence within the grain is referred to as a "lattice diffusion" or "surface diffusion".

The present inventors have determined the orientations of the plane parallel to a wiring metal surface and the plane perpendicular thereto for a crystal orientation of each crystal grain of a polycrystalline thin film, prior to determining the crystal axis excellent in the EM resistance, and determined the electric current direction and the crystal axis direction providing excellent EM resistance by clarifying the difference in EM when hillocks and voids occur.

Also, they have clarified that the optimal crystal axis direction of the wiring can be given in the formation of an orthogonal wiring which is orthogonal in a wafer surface.

First, the relation between the electric current direction and the EM in the metal crystal, resulting from the consideration thereof, will be described below.

As shown in FIG. 1, by passing the electric current through a polycrystal wiring having grain boundaries 20, 21, 22, 23 and 24, "the relation between the occurrence of voids and hillocks produced by the grain boundary diffusion and the crystal axis of grain" and "the relation between the occurrence of voids and hillocks within a certain crystal grain and the crystal axis" have been clarified. FIG. 1 is a plan view from above of the wafer showing a wiring having the width W formed on the LSI surface. The xy plane is a face parallel to a wafer surface, and parallel to a wiring surface. Herein, the electric current flows in the x direction.

The crystal axis for each crystal grain 30, 31, 32 and 33 in the polycrystal wiring as shown in FIG. 1 will be described. Conventionally, if the lattice plane parallel to the xy plane is a (001) plane, it is referred to as an (001) orientation. For example, there are <100> axis and <110> axis within the (001) plane, but it is very difficult to specify in which direction the <100> axis or <110> axis is oriented in the xy plane. As a result of an evaluation using the scan-type μ-RHEED microscope as disclosed in Jpn. J. Appl. Phys. 29 (1989) L2075 as previously mentioned, it has been revealed that it is possible to specify simply and nondestructively the lattice plane parallel to the xy plane and the direction of the crystal axis within the lattice plane parallel to the xy plane. With this method, it is also possible to observe the size of each crystal grain by visualizing the crystal grain.

The notation of the crystal plane or the crystal axis is as follows. The (100) plane, (1̄00) plane, (010) plane, (01̄0) plane, (001) plane and (001̄) plane, which are equivalent crystallographically, are denoted as {100}, {010} or {001}. The <100> axis, <1̄00> axis, <010> axis, <01̄0> axis, <001> axis and <001̄> axis, which are equivalent crystallographically, are denoted as [100], [010] or [001].

When the crystal grain boundary 22 of FIG. 1 is substantially parallel to the x axis, as when the crystal axes of the crystal grains 31, 32 in the x direction are [110] for a face-centered cubic lattice the occurrence of voids due to the grain boundary diffusion is less. Concentrating on a certain crystal grain, it is when the [110] axis and the x axis are parallel to each other that voids or hillocks are unlikely to occur in the electric current direction. The present inventors have discovered the above two points. That is, in a metal having a face-centered cubic lattice (thereinafter referred to as f.c.c.) crystal structure, when the [110] direction and the electric current direction are coincident, the grain boundary diffusion, the lattice diffusion and the surface diffusion are suppressed. Also, with a body-centered cubic lattice (thereinafter referred to as b.c.c.) crystal, when the [111] direction and the electric current direction are coincident, the occurrence of hillocks and voids with the EM can be suppressed.

The [110] direction of the f.c.c. crystal and the [111] direction of the b.c.c. crystal are crystal axis directions in which nearest neighboring atoms are arranged when the atomic arrangement constituting the metal is crystallographically considered. The [110] direction of the f.c.c. crystal and the [111] direction of the b.c.c. crystal are identical to those of crystal axes in which the nearest neighboring atoms are arranged.

Although the EM is said to be qualitatively a phenomenon in which metal atoms move due to electron flow, it was conventionally unexpected to find that the crystal axis direction for the arrangement of nearest neighboring atoms was superior in the EM resistance, because of the incapability of observing the EM in a specified crystal axis direction. In the f.c.c. crystal, the second nearest atom exists in the [100] direction, the third nearest atom in the [112] direction, and the fourth nearest atom in the [111] direction. In the b.c.c. crystal, the second nearest atom exists in the [100] direction, and the third nearest atom in the [110] direction.

Qualitatively, it is believed that the EM resistance in the f.c.c. structure is in the order of [110]>[100]>[112]>[111], while that in the b.c.c. structure is in the order of [111]> [100]>[110], but for the second and higher-order nearest atoms, it is difficult to evaluate the EM resistance within the scope of experimental facts owing to three dimensional effects.

Figure 2B:
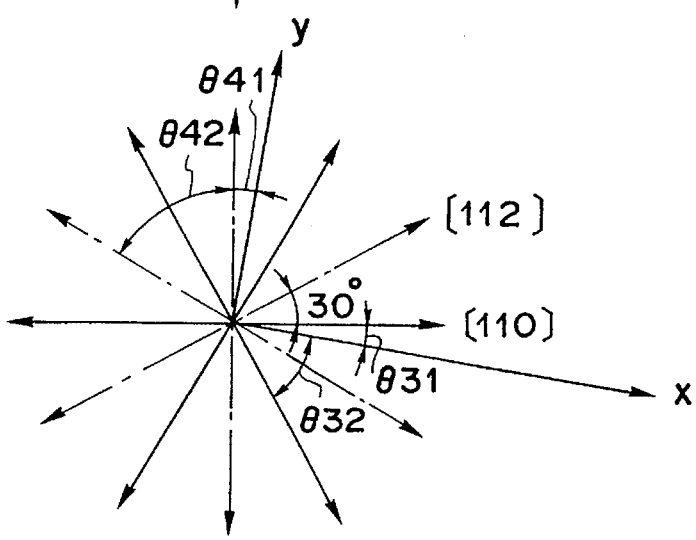
Figure 2C:
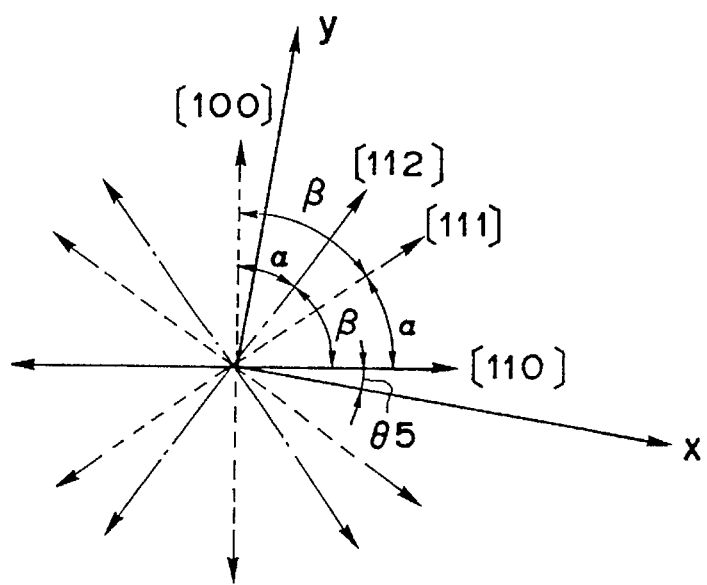

Al or Cu useful for the LSI wiring is an f.c.c. crystal, and Mo or W is a b.c.c. crystal. As in FIG. 1, in the xyz space, the xy plane is a plane parallel to a wafer surface in which the wiring is formed. The lattice plane of the wiring parallel to the xy plane is {100}, {111}, {110}, having different optimal wiring forming methods. In the following, the f.c.c. structure is considered. FIG. 2A shows the [100] and [110] axis directions within the {100} plane, FIG. 2B shows the [112] and [110] directions within the {111} plane, and FIG. 2C shows the [100], [110], [112], and [111] directions within the {110} plane.

In the {100} plane, there are four directions which are crystallographically equivalent to the [100] direction and the [110] direction, respectively. [100] and [110] are crossed with each other at 45°. It is assumed that the angle made by [110] relative to the x axis is $\theta_1$, and the angle made by [110] relative to the y axis is $\theta_2$. It is always true that $\theta_1+\theta_2=45°$.

In the {111} plane, there are six directions which are crystallographically equivalent to the [110] direction and the [112] direction, respectively. The [112] and the [110] are crossed with each other at 30°. It is assumed that the angles made by the [110] relative to the x axis are $\theta_{31}$ and $\theta_{32}$. It is assumed that the angles made by the [112] relative to the y axis are $\theta_{41}$ and $\theta_{42}$. Thus, $\theta_{31}+\theta_{32}=\theta_{41}+\theta_{42}=60°$, $\theta_{31}=\theta_{41}$ and $\theta_{32}=\theta_{42}$.

In the {110} plane, there are two directions which are crystallographically equivalent to the [110] direction, the [111] direction, the [112] direction and the [100] direction, respectively. The [110] direction and the [100] direction are crossed at right angles. Assuming that the angle at which [111] and [110] or [112] and [100] are crossed is α, and the angle at which [110] and [112] or [100] and [111] are crossed is β, $$\alpha = \tan^{-1}(1/\sqrt{2}) \approx 35.3°$$

$$\beta = \tan^{-1}(\sqrt{2}) \approx 54.7°$$

α+β is equal to 90°.

For the single crystal wiring, the measurement of the median time of failure up to the time of disconnection indicated that the relation between the current direction and the crystal axis in Al of a f.c.c. crystal was excellent in the EM resistance, when the angle θ made by the current direction relative to [110] was in a range from 0° to ±22.5°, and preferably superior in the EM resistance when it was in a range from 0° to ±5°, in a {100} oriented single crystal, (that is, when {100} is parallel to the xy plane); in a {111} oriented single crystal, the EM resistance was excellent, when the angle $\theta_2$ made by the current direction relative to [110] was from 0° to ±15°, and superior when it was from 0° to ±5°; in a {110} oriented single crystal, the EM resistance was excellent when the angle $\theta_3$ made by the current direction relative to [110] was from 0° to ±20°, and superior when it was from 0° to ±5°.

In the {100} plane, there are four directions which are equivalent to the [110] direction and the [100] direction, respectively. It is noted herein that the [110] directions excellent in the EM resistivity are crossed orthogonally. If the xy plane is a plane parallel to the wafer surface, the current flows in both the x axis and the y axis. Accordingly, for the single crystal wiring, if <110> is parallel to the x axis in a (001) oriented plane, the <1̄10> direction becomes parallel to the y axis, so that it is possible to increase the EM resistance for the wiring in two orthogonal directions on the LSI.

The embodiments of the present invention will be described below.

(Embodiment 1)

Figure 3B:
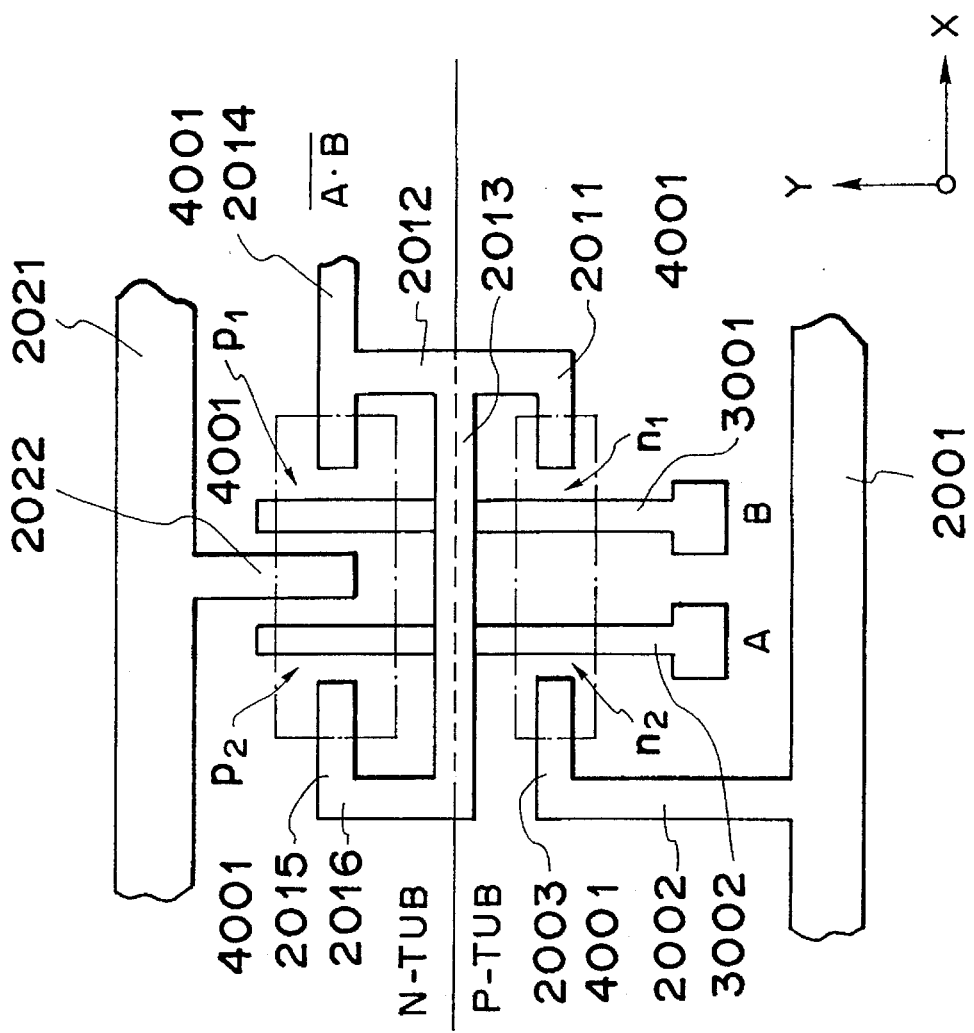
FIGS. 3A and 3B are views showing one embodiment of the present invention.
Figure 3A:
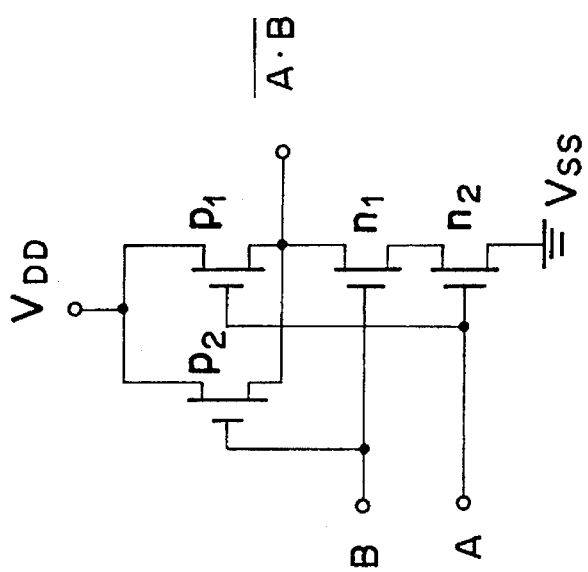

FIG. 3 is a typical view for explaining a semiconductor circuit device in one embodiment of the present invention, in which FIG. 3A is a circuit and FIG. 3B is a layout. As shown in FIG. 3A, this embodiment is a NAND circuit of CMOS containing P channel MOSFETs ($P_1$), ($P_2$) and N channel MOSFETs ($n_1$), ($n_2$). This NAND circuit is formed on an Si wafer having a plane orientation (111), the X direction in the figure being a current flow direction through the Al wirings 2001, 2003, 2011, 2013, 2014, 2015, 2021, that is, a [110] direction of Al.

On the other hand, the Y direction is a current flow direction through the Al wirings 2002, 2012, 2016, 2022, (that is, a [110] direction of Al). The Z direction or the direction perpendicular to a paper surface of FIG. 3 is a thickness direction of all Al wirings, and a depth direction of a contact hole 4001, or a [100] direction of Al.

Here, the Al wiring 2021 is at a positive reference power supply $V_{DD}$ line, and the Al wiling 2001 is at a reference voltage $V_{SS}$ line. They are commonly connected to a plurality of semiconductor elements.

A fabricating method of this embodiment will be described below.

The fabricating method of PMOSFET and NMOSFET uses a well known polycrystal silicone gate CMOS process, which will be briefly described, and a forming method of the Al wiring will be described in detail.

An n-type Si wafer having a plane orientation (111) is prepared.

A P well is formed to form the nMOSFET.

To form an active region, a field oxide film is formed with a selective oxidation method.

A gate oxide film is formed.

A gate electrode is formed by depositing and patterning a polycrystal silicone.

A source region and a drain region of the nMOSFET are formed by selectively implanting Arsenic ions and through the heat treatment.

A source region and a drain region of the pMOSFET are formed by selectively implanting Boron ions and through the heat treatment.

A silicone oxide film (PSG) containing phosphorus is deposited and heat treated.

To form contact holes, a part of the PSG film is removed by the dry etching to have a contact hole of 0.8 μm square.

Next, Al is deposited on the contact hole or a portion in which the Si surface is exposed from the PSG film as an insulating film.

This metallization process adopts the CVD method using dimethyl aluminum hydride (DMAH) as a source gas and hydrogen as a reaction gas.

A substrate formed with contact holes and having its surface treated with the HF solution is disposed within a reactor, into which DMAH and $H_2$ gas are introduced, and Al is deposited thereon selectively at a substrate temperature of 280° C. Using this process results in, Al within a contact hole as a single crystal Al having a plane orientation (100).

Then, with the plasma CVD method using DMAH, Al is deposited on an entire surface of the substrate. Here, by using the plasma, the selectivity in depositing Al is lost, so that Al is deposited on the entire surface of the substrate. Using a laser beam, with a solid phase epitaxial growth method having the Al single crystal within the contact hole as a seed, the polycrystal Al on the PSG film is converted into single crystal. Here, using a scan-type μ-RHEED microscope, the crystal face in a plane direction (xy plane direction) of single crystal Al is observed. By designing and using a mask pattern of the Al wiring in which Al is (100) oriented single crystal, with the x axis being in a direction parallel to [110], and the y axis being in a direction parallel to [110], a mask and a wafer are aligned so as to have a layout as shown in FIG. 3B, and Al is then patterned. Thus, the Al wiring of FIG. 3B is formed.

Figure 4:
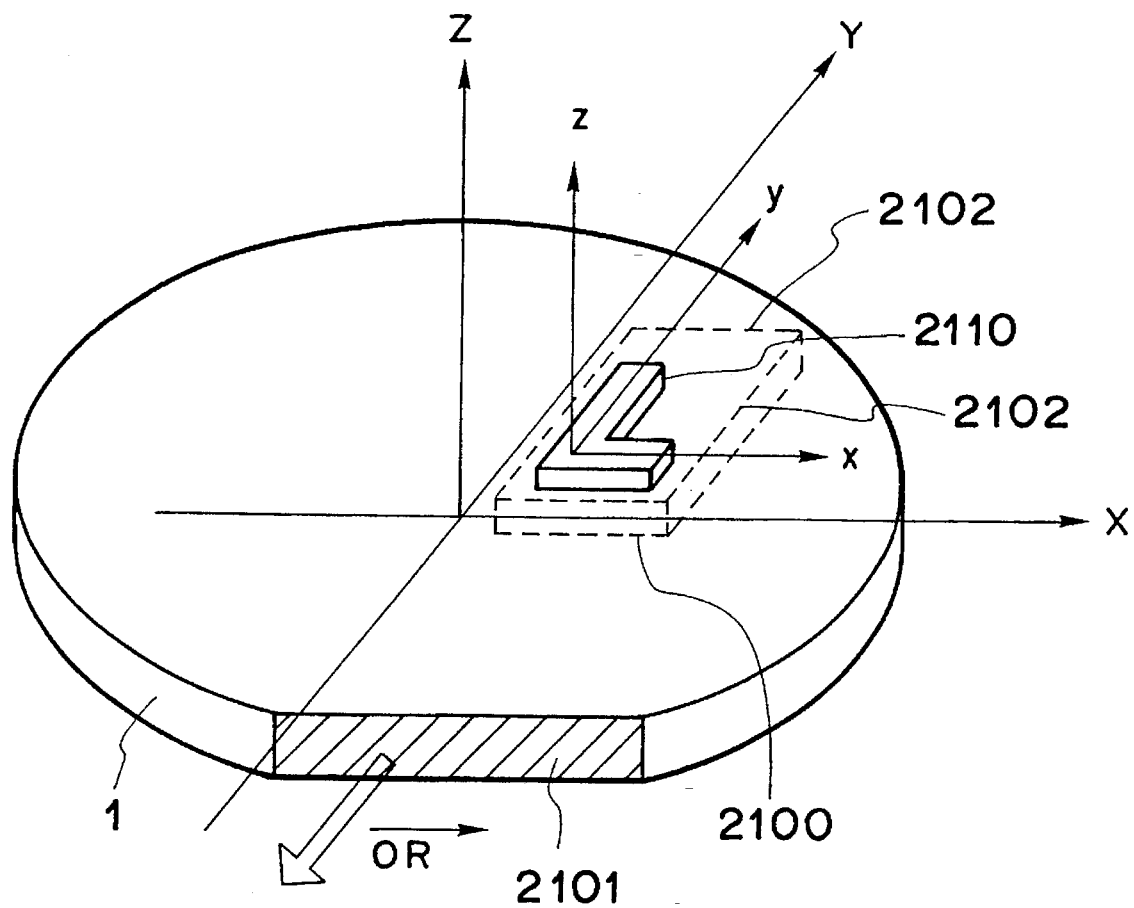
FIG. 4 is a view for explaining an Si chip and the wiring orientation.

In the fabrication method as above described, the wafer is dealt with in the following manner. That is, referring to FIG. 4, in an LSI formed with a plurality of rectangular chips 2100 on an Si wafer 1, a specific crystal axis of the wiring and an orientation flat face 2101 of the Si wafer are aligned.

The plane orientation of the Al wiring is that of (001) single crystal. It is assumed that the z axis is parallel to <001>. The orthogonal wiring within a chip was formed such that the <110> direction within the (001) plane and the x axis, and the <1̄10> direction and the y axis, might be parallel to each other. Also, each side of the rectangular chip was parallel to the x axis and the y axis.

The wafer 1 was fabricated such that a vector $\overrightarrow{OR}$ representing the orientation flat face was substantially parallel to the y axis or the x axis.

In this way, it is possible to cut out many chips most efficiently, as well as increasing the accuracy of the wiring pattern as previously described, so that the EM resistance is increased. Note that 2102 is a side of the rectangular chip, and 2110 is an Al wiring.

Besides, by heating a back face of the substrate using an Si (111) wafer, an Al (111) film may be formed in accordance with Si (111) and used as the wiring. Further, in the above described embodiment 1, the Si (111) wafer was used, but with the solid phase growth in which a back face of the substrate is heated using an Si (100) wafer, an Al (100) film may be formed and used in accordance with Si (100).

(Another Embodiment)

In the embodiment 1 as described above, the single crystal Al wiring was described. However, in a polycrystalline material, it is required that by controlling the orientation for at least more than 50% or preferably more than 95% of crystal grains (single crystal) constituting the polycrystal material, the crystal axis through which nearest neighboring atoms are arranged is parallel to the current direction. Such a control for the orientation is possible by controlling the energy amount or the laser beam scan speed in a laser beam in the above embodiment.

The material may be Cu rather than Al that is a face-centered cubic lattice, in which the wiring is patterned so that like Al, the current flow direction is a <011> direction.

Apart from that, when W or Mo that is a body-centered cubic lattice is used, the wiring is patterned so that the current flow direction is a <111> direction. Examples of single crystals of face-centered cubic lattice to be used are those having {100} orientation, {111} orientation and {110} orientation, the upper face of the film being {100}, {111} and {110}, respectively.

Among them, the {100} oriented single crystal is most preferable because it has four directions equivalent to [100] direction which are selected as the current flow direction in a film plane (XY plane in FIG. 4), those directions being orthogonal to each other.

When a wiring pattern is used in which two directions of the wiring are crossed at about 60°, rather than at right angles, it is preferable to use a {111} oriented single crystal. Further, when the wiring in only one direction is used, it is possible to use a {110} oriented single crystal.

In the following, several experimental examples are described to show metal films applicable to the present invention, and the effects of the present invention will be described in detail.

(Experimental Example 1)

The changes occurring in each crystal grain boundary and each crystal grain were observed by passing the electric current through a wiring metal as shown in FIG. 1.

The fabrication method of the wiring metal of FIG. 1 is as follows. An Si substrate is thermally oxidized and Cu is deposited on a thermally oxidized $SiO_2$ film (thickness: 1 μm) over the entire surface of a wafer with the bias sputtering method. The thickness of a Cu layer is 0.5 μm, with a wiring width of 30 μm. At both ends of the wiring are formed a pad (not shown) for passing the current, and a pad (not shown) for measuring the voltage.

The procedure for passing the electric current, the determination of the crystal orientation, and the observation procedure will be described in the following:

A wafer fabricated with the above procedure and formed with a wiring metal is loaded into a scan-type μ-RHEED microscope. The current and voltage terminals at both ends of the wiring are connected to terminals outside of the scan-type μ-RHEED microscope within the device using a wire. First, at a room temperature, and without passing the electric current, the shape of each crystal grain within the wiring and the crystal axis orientation within each crystal grain are determined. The electron beam diffraction pattern observation with the scan-type μ-RHEED microscope and the scan-type μ-RHEED microscope observation allow the determination for ① the distribution of crystal grains, and ② for each crystal grain, "the crystal orientation of the lattice plane parallel to a surface of wiring metal (XY plane)" and "which direction the lattice plane perpendicular to the surface of wiring metal (X plane) faces, that is, in which direction the crossing line between its lattice plane and the XY plane is oriented in the XY plane". Next, a measurement sample is heated, and the distribution of crystal grains and the crystal axis orientation of each crystal grain as above described are observed while a constant current is passed through the wiring metal. At the same time, the shape variation such as a surface form of the wiring is observed with the scan secondary electron image observation.

Figure 5:
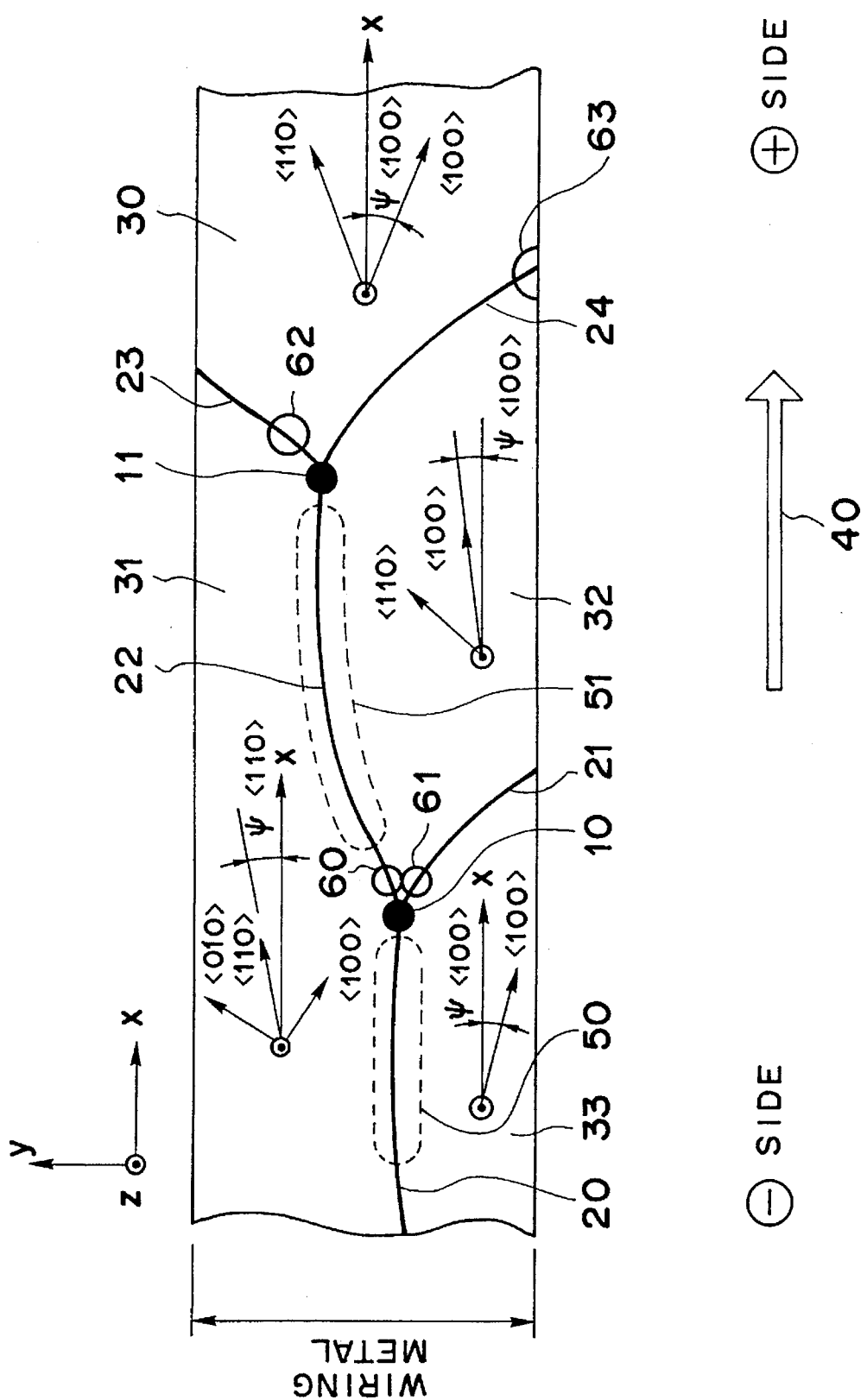
FIG. 5 is a view for explaining voids and hillocks occurring in the wiring metal.

With the above procedure, the Cu wiring was observed. The film thickness of the Cu wiring was 0.5 μm. FIG. 1 shows an observation example for the distribution of crystal grains and the crystal axis orientation within each crystal grain for the Cu wiring, and FIGS. 5 and 6 show voids and hillocks observed after passing the current flow. The crystal axis orientation of each crystal grain before passing the current flow will be described.

In the following description, (100), ($\bar{1}$00), (010), (0$\bar{1}$0), (001) and (00$\bar{1}$) planes which are crystallographically equivalent are collectively denoted as {100}. Similarly, (110), (1$\bar{1}$0), ($\bar{1}$10), ($\bar{1}\bar{1}$0), (011), (01$\bar{1}$), (0$\bar{1}$1), (0$\bar{1}\bar{1}$), (101), (10$\bar{1}$), ($\bar{1}$01) and ($\bar{1}$0$\bar{1}$) are collectively denoted as {110}. Similarly, (111), (11$\bar{1}$), (1$\bar{1}$1), (1$\bar{1}\bar{1}$), ($\bar{1}$11), ($\bar{1}$1$\bar{1}$), ($\bar{1}\bar{1}$1) and ($\bar{1}\bar{1}\bar{1}$) are denoted as {111}. For the crystal axis, <100>, <$\bar{1}$00>, <010>, <0$\bar{1}$0>, <001> and <00$\bar{1}$> which are crystallographically equivalent are denoted as [100]. Similarly, <110>, <1$\bar{1}$0>, <$\bar{1}$10>, <$\bar{1}\bar{1}$0>, <101>, <10$\bar{1}$>, <$\bar{1}$01>, <$\bar{1}$0$\bar{1}$>, <011>, <01$\bar{1}$>, <0$\bar{1}$1> and <0$\bar{1}\bar{1}$> are denoted as [011]. Similarly, <111>, <11$\bar{1}$>, <1$\bar{1}$1>, <1$\bar{1}\bar{1}$>, <$\bar{1}$11>, <$\bar{1}$1$\bar{1}$>, <$\bar{1}\bar{1}$1> and <$\bar{1}\bar{1}\bar{1}$> are denoted as [111].

For simplification of the explanation, it is assumed that the plane parallel to the wiring surface is the xy plane, and the plane perpendicular thereof is the z axis direction. And it is assumed that the longitudinal direction of the wiring is the x axis. The upper faces of crystal grains 30, 31, 32 and 33 were all (001) planes.

That is, the z axis and the <001> direction were substantially parallel. In the {100} plane are contained [100] and [110] as the crystal axis direction. The [100] and [110] axes are crossed with each other at an angle of 45° within the {100} plane. In a crystal grain 30, the <100> axis is crossed with the x axis at an angle of about 20°. In the following, the angle made by the [100] axis relative to the x axis within the xy plane is denoted as φ [100], and the angle made by the [110] axis relative to the x axis is denoted as φ [100]. That is, in the crystal grain 30, φ [100] was about 20°. Similarly, in a crystal grain 31, φ [110] was about several degrees, in a crystal grain 32, φ [100] was about several degrees, and in a crystal grain 33, φ [100] was about 15°.

With the scan-type μ-RHEED image observation, the grain boundary 20, 21, 22, 23 for each crystal grain, the plane orientation for each crystal grain, and [110], [100] directions were determined in a nondestructive manner as described above.

The electric current was passed through the wiring within the scan-type μ-RHEED microscope. The temperature of the wiring was about 250° C., and the current density was about $5 \times 10^5$ A/cm². As shown in FIGS. 5 and 6, the following points were observed in passing the electricity. The arrow 40 in FIGS. 1, 5 and 6 indicates the electron flow.

① At the grain boundaries 20, 22 on the negative electrode side of triple points 10, 11 of the grain boundary, voids were observed. The area where voids were observed is indicated by reference numerals 50, 51 in FIG. 5.

② In correspondence with the creation of the voids 50, 51, hillocks were observed on the positive electrode side of the tripe points 10, 11. The positions where hillocks were observed are 60, 61, 62 in the vicinity of the triple points on the positive electrode side thereof. Also, a hillock was observed at a wiring termination 63 of a grain boundary 24 on the positive electrode side of the triple point.

Figure 6A:
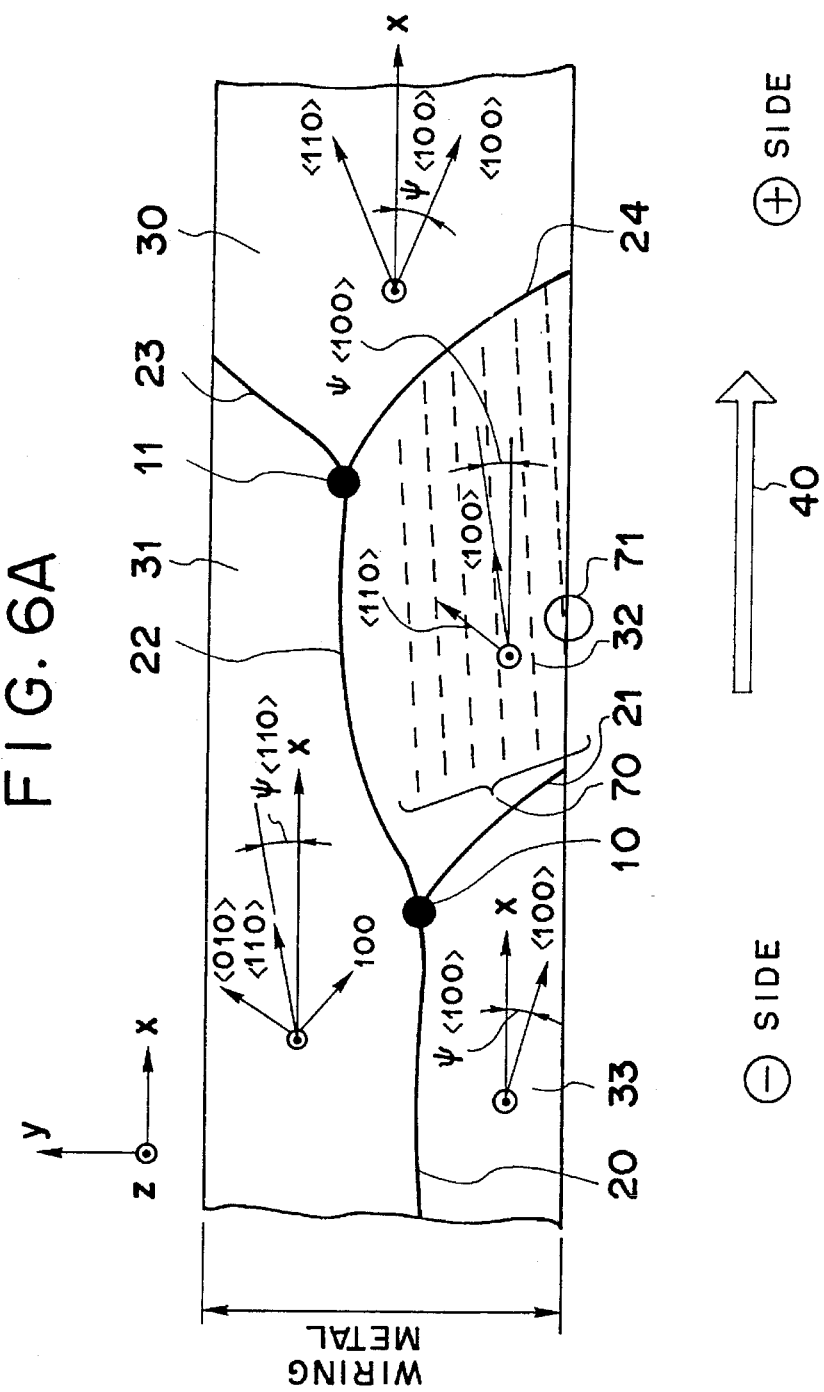
FIGS. 6A and 6B are views showing linear voids occurring in the wiring metal.
Figure 6B:

③ As shown in FIG. 6A, in a crystal grain 32, a void 70 was linearly created in parallel to the <100> direction. The void 70 is such that a plurality of lines each containing small linear voids aligned on the line are created. Observing each of small voids microscopically by enlarging a portion 71 of FIG. 6A as shown in FIG. 6B, it has been seen that a void 70A is formed on the negative electrode side, and a hillock 70B is formed on the positive electrode side. In the crystal grains 30, 31 and 32, linear voids which were observed in the crystal grain 32 were not observed.

The above measurements were performed for a variety of wirings in various combinations from the Cu film thickness of 0.1 µm, 0.2 µm, 0.3 µm, 0.4 µm, 0.5 µm, 0.6 µm, 0.7 µm, 0.8 µm, 0.9 µm, 1 µm, 1.2 µm, 1.5 µm, and 2 µm, and the wiring width of 0.3 µm, 0.5 µm, 0.8 µm, 1 µm, 2 µm, 5 µm, 10 µm, 20 µm, 30 µm, 40 µm, and 50 µm.

(Experimental Example 2)

In the same procedure as in experimental example 1, the Cu wirings having different film thicknesses and wiring widths were formed and, the relation between the occurrence of voids and hillocks as shown in ①, ② and ③ in experimental example 1 and the crystal axis direction for each crystal grain was observed. The observation was performed for a variety of wirings in various combinations from the Cu film thickness of 0.1 µm, 0.2 µm, 0.3 µm, 0.4 µm, 0.5 µm, 0.6 µm, 0.7 µm, 0.8 µm, 0.9 µm, 1 µm, 1.2 µm, 1.5 µm and 2 µm, and the wiring width of 0.3 µm, 0.5 µm, 0.8 µm, 1 µm, 2 µm, 5 µm, 10 µm, 20 µm, 30 µm, 40 µm and 50 µm.

The following points were observed in the Cu wiring of which the lattice plane parallel to the wiring metal surface (xy plane) was {100}.

⓪ As shown in FIG. 5, voids 50, 51 occurred at the grain boundaries on the negative electrode side of triple points 10, 11, and hillocks occurred at positions as indicated by numerals 60, 61, 62 on the positive electrode side of the triple points 10, 11 or at a position of the wiring termination 63. The occurrence of voids at the grain boundary when the grain boundary is substantially parallel to the x axis in the wiring direction, like the grain boundary 22, depends on the crystal axis direction of crystal grains 31, 32 meeting at the grain boundary therebetween.

From the comparison of the cases where, (a) $\phi$ [100] of the crystal grain 31 of FIG. 5 is below about ±10 degree, and $\phi$ [100] of the crystal grain 32 is below about ±10 degree;

(b) $\phi$ [100] of the crystal grain 31 is below about ±10 degree, and $\phi$ [110] of the crystal grain 32 is below about ±10 degree;

(c) $\phi$ [110] of the crystal grain 31 and $\phi$ [110] of the crystal grain 32 are both below about ±10 degree; it has been found that the occurrence of voids at the crystal grain boundary is such that (a) is most remarkable, and (b) and (c) are smaller in this order. In (c), a slight amount of voids occurred. In the order of (a), (b) and (c), the occurrence of hillocks as shown by 62, 63 in FIG. 5 decreased.

② Noting individual crystal grains, the occurrence of linear voids within the crystal grain differed depending on the size of $\phi$ [100] of $\phi$ [110].

The direction of the linear void is not always coincident with the current direction, and substantially coincident with the [100] direction.

From the comparison of the cases where, (d) When $\phi$ [100] is from 0° to about 5°;
(e) When $\phi$ [100] is from about 5° to about 22.5°;
(f) When $\phi$ [100] is from about 22.5° to about 40°;
(g) When $\phi$ [100] is from about 40° to about 45°;
or representing (d), (e), (f) and (g) with $\phi$ [110] as the [100] and [110] directions are crossed with each other at 45°,
(d)' When $\phi$ [110] is from about 40° to about 45°;
(e)' When $\phi$ [110] is from about 22.5° to about 40°;
(f)' When $\phi$ [110] is from about 5° to about 22.5°;
(g)' When $\phi$ [110] is from 0° to about 5°;
it has been found that the occurrence of linear voids is greatest in (d) and (d)', that is, when the [100] direction is coincident with the current direction, and no voids occurs in (g) and (g)', that is, when the [110] direction is coincident with the current direction. The occurrence of linear voids within the crystal grain was smaller in the order of (d)→ (e)→(f)→(g).

When the crystal plane parallel to the wiring metal surface (xy plane) was {111}, the following were observed:

For the Cu wiring in which the lattice plane parallel to the wiring metal surface (xy plane) was {100}, the following items were observed.

Figure 7:
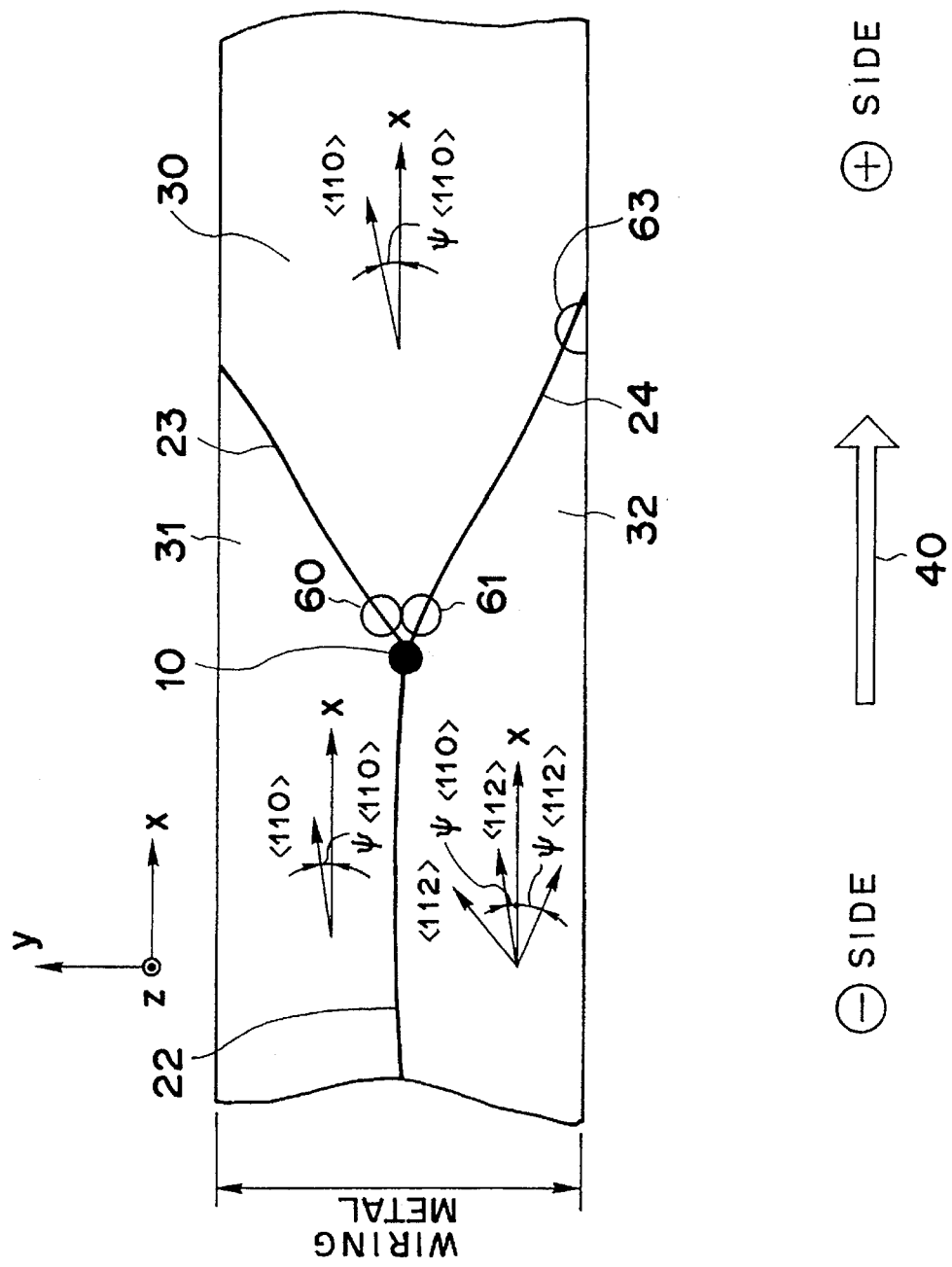
FIG. 7 is a view showing voids occurring at a crystal grain boundary.

① In FIG. 7, voids occurred at a crystal grain boundary 22 on the negative electrode side of triple point 10, and hillocks occurred at positions as indicated by numerals 60, 61 on the positive electrode side of the triple point 10 or at a position of the wiring termination 63. The occurrence of voids at the grain boundary when the grain boundary like the grain boundary 22 is substantially parallel to the x axis in the wiring direction depends on the crystal axis direction of crystal grains 31, 32 meeting at the grain boundary therebetween.

From the comparison of the cases where, (a) $\phi$ [112] of the crystal grain 31 of FIG. 7 is below about ±10 degree, and $\phi$ [112] of the crystal grain 32 is below about ±10 degree;

(b) $\phi$ [112] of the crystal grain 31 is below about ±10 degree, and $\phi$ [110] of the crystal grain 32 is below about ±10 degree;

(c) $\phi$ [110] of the crystal grain 31 and $\phi$ [110] of the crystal grain 32 are both below about ±10 degree; it has been found that the occurrence of voids at the crystal grain boundary is such that (a) is most extensive, and (b) and (c) are smaller in this order. In (c), a slight amount of voids occurred. In the order of (a), (b) and (c), the occurrence of hillocks as shown by 62, 63 in FIG. 7 decreased.

② Nothing individual crystal grains, the occurrence of linear voids within the crystal grain was different depending on the size of $\phi$ [112] or $\phi$ [110]. The direction of linear voids was not always coincident with the current direction, and substantially coincident with the [112] direction.

From the comparison of the cases where, (d) When $\phi$ [112] is from 0° to about 5°;
(e) When $\phi$ [112] is from about 5° to about 15°;
(f) When $\phi$ [112] is from about 15° to about 20°;
(g) When $\phi$ [112] is from about 25° to about 30°;
or representing (d), (e), (f) and (g) with $\phi$ [110] as the [112] and [110] directions are crossed with each other at 60°,
(d)' When $\phi$ [110] is from about 30° to about 25°;
(e)' When $\phi$ [110] is from about 25° to about 15°;
(f)' When $\phi$ [110] is from about 15° to about 5°;
(g)' When $\phi$ [110] is from 0° to about 5°;
it has been found that the occurrence of linear voids is greatest in (d) and (d)', that is, when the [112] direction is coincident with the current direction, and no voids occurs in (g) and (g)', that is, when the [110] direction is coincident with the current direction. The occurrence of linear voids within the crystal grain was smaller in the order of (d)→ (e)→(f)→(g).

Comparing two cases in which the [100] direction and the [112] direction were coincident with the current direction, the occurrence of linear voids was greater when the [100] direction was coincident with the current direction.

In either case of the {100} orientation and the {111} orientation, the occurrence of linear voids were not observed when the [110] axis was coincident with the current direction.

When the lattice plane parallel to the wiring metal surface (xy plane) was {110}, the following items were observed.

① At triple point of the crystal grain boundary, in the {100} orientation, like the {111} orientation, voids were observed at the grain boundary on the negative electrode side and hillocks on the positive electrode side.

② Within individual crystal grains, from the comparison of the cases (a), (b), (c) and (d) where, (a) When the [110] direction is substantially coincident with the current direction;

(b) When the [112] direction is substantially coincident with the current direction;

(c) When the [111] direction is substantially coincident with the current direction;

(d) When the [100] direction is substantially coincident with the current direction;

it has been found that in (a), almost no linear voids occur, and in (d), many voids occur. In (b) and (c), linear voids occurred, but the number of voids was between those in (a) and (d).

(Experimental Example 3)

For an Al wiring, the same observation as in experimental examples 1, 2 was made. The result was the same as in experimental examples 1, 2.

(Experimental Example 4)

For Al—Si, Al—Si—Cu and Al—Cu wirings, the same observations as in experimental examples 1, 2 were performed. When the Si content in Al—Si was 0.1%, 0.2%, 0.5% and 1%, when the Cu content in Al—Cu was 0.1% 0.2% 0.5% and 1% and when the Si content was 0.1%, 0.2% 0.5% and 1% and the Cu content was 0.1%, 0.2%, 0.5% and 1%, in Al—Si—CU, in combinations thereof, the observations were performed.

The result was the same as in experimental examples 1, 2.

(Experimental Example 5)

The measurement of the time up to the disconnection was made when the current was passed through a single crystal Al wiring.

The fabrication of a sample is as follows.

First, when a high resistive Si substrate was used, Al was deposited with the low pressure heating CVD method using dimethyl aluminum hydride and hydrogen. At this time, (111) Al was grown on the (100) Si, and (100) Al was grown on the (111) Si as the single crystal. The single crystal Al on $SiO_2$ was such that on an Si substrate having viaholes opened on the oxide film, a single crystal Al was selectively grown only on a portion of the viahole with the above CVD method. Then, using a plasma, a very thin film layer of Al was formed on selectively deposited Al and $SiO_2$, and thereafter, Al was grown on the entire surface of a wafer with the low pressure heating CVD method. Al on the entire surface of the wafer was polysilicone. This wafer was subjected to the heat treatment for the single crystallization. And the single crystal Al film on the Si wafer or the $SiO_2$ was patterned for the wiring using the photolithography technique. The wiring was disposed on one straight line, having an electric current terminal and a voltage terminal provided at both ends. The current flowed in a longitudinal direction (thereinafter referred to as the x direction) of the wiring. The wiring length was 100 μm, 500 μm, 1 mm and 5 mm. Also, the wiring width was 0.2 μm, 0.5 μm, 1 μm, 2 μm, 5 μm, 10 μm and 30 μm. The Al film thickness was 0.2 μm, 0.5 μm, 1 μm and 2 μm. The wirings in combinations of the wiring length, the wiring width and the Al film thickness were formed in 4×7×4=112 ways.

The x axis direction and the crystal axis direction of the wiring, when the current direction is the x axis direction, are as follows. $\theta_1$, $\theta_{31}$ and $\theta_5$ as defined in FIG. 2 are used, where $\theta_1$ is an angle made by the [110] direction relative to the x axis (current direction) within the {100} plane, $\theta_{31}$ is an angle made by the [110] direction relative to the x axis (current direction) within the {111} plane, and $\theta_5$ is an angle made by the [110] direction relative to the x axis (current direction) within the {110} plane.

In a {100} oriented single crystal, the samples were measured at intervals of 2.5° for the wiring when $\theta_1$ was from 0° to 45°. In a {111} oriented single crystal, the samples were measured at intervals of 2.5° for the wiring when $\theta_1$ was from 0° to 30°. In a {110} oriented single crystal, the samples were measured at intervals of 2.5° for the wiring when $\theta_1$ was from 0° to 90°.

At experiment temperatures of 175° C., 200° C., 250° C., 275° C. and 300° C., and with electric current densities of $2\times10^6$ A/cm$^2$, $5\times10^6$ A/cm$^2$ and $1\times10^7$ A/cm$^2$, the median value of failure MTF for the time up to the disconnection of each wiring was measured.

In the above samples, MTF was longest at $\theta_1=0°$, $\theta_{31}=0°$ and $\theta_5=0°$ in any case of {100}, {111} and {110} oriented single crystals, and decreased with larger $\theta_1$, $\theta_{31}$ and $\theta_5$. MTFs at $\theta_1=0°$, $\theta_{31}=0°$ and $\theta_5=0°$ were substantially equal.

In the {100} oriented single crystal, MTFs from $\theta_1=0°$ to $\theta_1=0°$ were substantially equal, and MTF from $\theta_1=7.5°$ to $\theta_1=22.5°$ exceeded about 90% of an MTF ($\theta_1=0°$). With larger $\theta_1$, MTF drastically decreased and decreased monotonically corresponding to $\theta_{31}$.

In the {111} oriented single crystal, MTFs from $\theta_{31}=0°$ to $\theta_1=5°$ were substantially equal, and MTF from $\theta_{31}=7.5°$ to $\theta_1=15°$ exceeded about 90% of an MTF ($\theta_{31}=0°$). With larger $\theta_{31}$, MTF drastically decreased and decreased monotonically corresponding to $\theta_{31}$.

In the {110} oriented single crystal, MTFs from $\theta_5=0°$ to $\theta_5=5°$ were substantially equal, and MTFs from $\theta_5=7.5°$ to $\theta_1=17.5°$ exceeded about 90% of an MTF ($\theta_5=0°$). If $\theta_5$ was more than 20°, MTF drastically decreased and decreased monotonically corresponding to $\theta_5$.

(Experimental Example 6)

Figure 8:
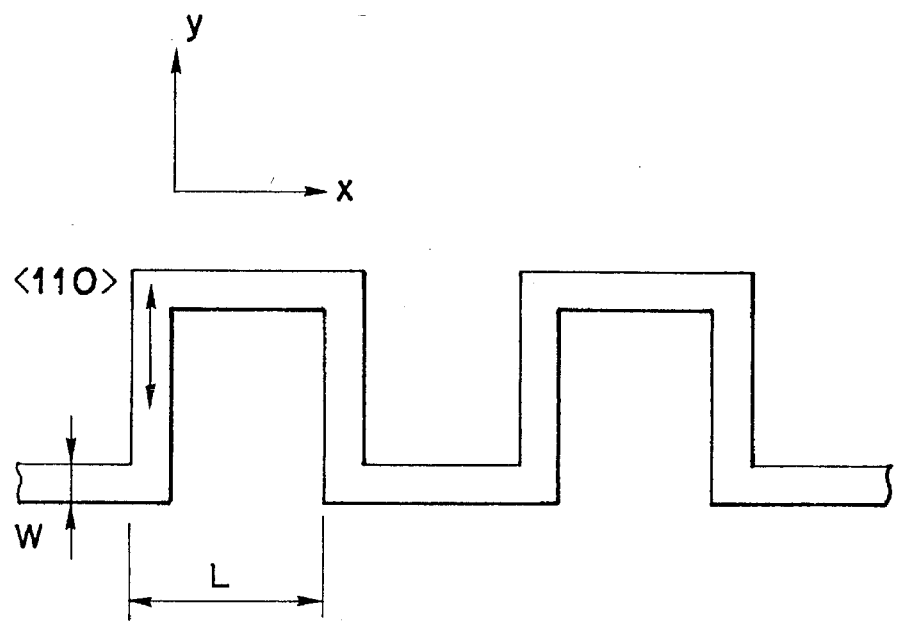
FIG. 8 is a view showing one example of a wiring pattern.

As shown in FIG. 8, for the wiring having a crank structure, the MTF was measured when the current flowed. The film thickness and the wiring width W were the same as in experimental example 5. The length L of the crank was 10 times, 20 times and 100 times a wiring width W.

Using $\theta_1$, $\theta_2$, $\theta_{31}$, $\theta_{32}$, $\theta_{41}$, $\theta_{42}$ and $\theta_5$ as defined in FIG. 2, and with the relation between the 10 crystal axis within the wiring and the x and y directions of the crank, the wirings were formed in the following combinations.

For a {100} oriented single crystal, the wirings at intervals of 2.5° when $\theta_1$ was from 0° to 45° were measured.

For a {111} oriented single crystal, the wirings at intervals of 2.5° when $\theta_{31}$ was from 0° to 30° were measured.

For a {110} oriented single crystal, the wirings at intervals of 2.5° when $\theta_5$ was from 0° to 30° were measured.

Here, $\theta_1$ is an angle made by the [110] direction relative to the x axis within the {100} plane, $\theta_{31}$ an angle made by the [110] direction relative to the x axis within the {111} plane, and $\theta_5$ is an angle at which the [110] direction and the x axis are crossed within the {110} plane. The measurement conditions of MTF are the same as in experimental example 5.

For the {100} oriented single crystal, MTF was longest at $\theta_1=0°$, then decreasing with larger $\theta_1$, and shortest at $\theta_1=45°$. Especially, there was no significant difference of MTF from $\theta_1=0°$ to $\theta_1=5°$, and MTF from $\theta_1=7.5°$ to $\theta_2=22.5°$ was about 90% of an MTF ($\theta_1=0°$). Above $\theta_2=25°$, MTF greatly decreased, and MTF ($\theta_1=45°$) as about 50% of an MTF ($\theta_1=0°$).

For the {111} oriented single crystal, MTF was longest at $\theta_{31}=0°$, then decreasing with larger $\theta_{31}$, and shortest at $\theta_{31}=30°$. There was no significant difference of MTF from $\theta_{31}=0°$ to $\theta_{31}=5°$, and MTF from $\theta_{31}=7.5°$ to $\theta_{31}=15°$ was about 90% of an MTF ($\theta_{31}=0°$). Above $\theta_{31}=15°$, MTF greatly decreased, and MTF ($\theta_{31}=30°$) was about 50% of an MTF ($\theta_{31}=0°$).

For the {110} oriented single crystal, MTF was longest at $\theta_5=0°$, then decreasing with larger $\theta_5$. MTFs from $\theta_5=0°$ to $\theta_5=5°$ were substantially equal, and MTF from $\theta_5=7.5°$ to $\theta_5=17.5°$ was about 90% of an MTF ($\theta_5=0°$). From $\theta_5=20°$ to 90°, MTF greatly decreased, and MTF from $\theta_5=30°$ to $\theta_5=90°$ was about 50% of an MTF ($\theta_5=0°$).

The magnitude relation between

MTF ($\theta_1=0°$) which is largest in the {100} oriented single crystal,

MTF ($\theta_{31}=0°$) which is largest in the {111} oriented single crystal,

MTF ($\theta_5=0°$) which is largest in the {110} oriented single crystal, was in the order of MTF ($\theta_1=0°$)>MTF ($\theta_{31}=0°$)>MTF ($\theta_5=0°$).

(Experimental Example 7)

MTF of the polycrystal Al wiring on $SiO_2$ was measured.

The first sample was such that Al was deposited on thermally oxidized $SiO_2$ with the well-known sputtering method. The wiring width W was 0.5 μm, 1 μm and 2 μm. The film thickness was 0.2 μm, 0.4 μm, 0.6 μm, 0.8 μm and 1 μm. This wiring had a so-called bamboo structure as typically shown in FIG. 9 in which the crystal grain boundaries 20, 21, 22, 23 are perpendicular to a longitudinal direction of the wiring (the x direction in FIG. 9). The plane parallel to an orientation surface of each crystal grain 30, 31, 32, 33 (the plane parallel to the xy plane) was a {111} plane, while the lattice plane perpendicular to the wiring plane was rotated irregularly within the {111} plane. That is, the angle made by for example the [110] direction to the x axis within the {111} plane was presented irregularly.

Figure 9:
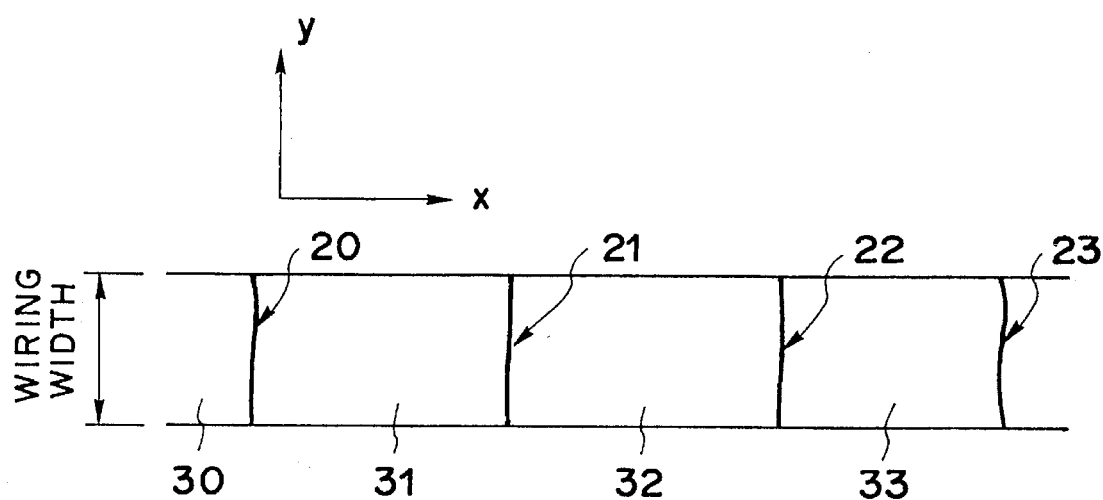
FIG. 9 is a view showing the shape of a crystal grain in an Al wiring fabricated with the CVD method.

The second sample was an Al film fabricated with the same CVD method as in experimental example 5, in a shorter heat treatment time of the Al film on $SiO_2$ than in experimental example 5. The Al film thickness was 0.2 μm, 0.5 μm, 0.6 μm, 0.8 μm, and 1 μm. In this case, when Al on $SiO_2$ was patterned in the width W of 0.5 μm, 1 μm and 2 μm, it had a bamboo structure rather than a complete single crystal as shown in FIG. 9. When the plane parallel to the wiring surface of each crystal grain 30, 31, 32, 33 (plane parallel to the xy plane) was a {111} plane, the [110] direction within the {111} plane was aligned substantially in the same direction. The wiring was patterned such that the [110] direction and the longitudinal direction of the wiring or the x axis direction might be coincident. The angle made by the [110] direction within each crystal grain to the x axis was within about ±15°.

The third sample was such that in the second sample, the wiring was patterned at an angle made by the [110] direction within each crystal grain to the x axis within about 45°±22.5°. Representing the [110] direction, the angle made by the [100] direction to the x axis was within about ±22.5°.

The fourth sample was fabricated in the same procedure as the second sample, and the plane parallel to the wiring surface of each crystal grain 30, 31, 32, 33 (plane parallel to the xy plane) was a {100} plane. It was patterned such that the [110] direction within the {100} plane was coincident with the longitudinal direction of the wiring or the x axis direction. The angle made by the [110] direction within each crystal grain to the x axis was within about ±22.5°. The film thickness and the wiring width were the same as in the second sample.

The fifth sample was such that in the fourth sample, the wiring was patterned at an angle made by the [112] direction within each crystal grain to the x axis within about ±15°.

MTF was measure with the same procedure as in experimental example 5. It is well known that in the first sample, the size of each crystal grain is different depending on the sputtering conditions or the heat treatment after the sputtering. In the second to fourth samples, the size of each crystal grain is different depending on the viahole diameter at the Al growth, the deposition temperature and the annealing time. In the first to fifth samples having the substantially same size of crystal grain, the MTF measurements for the first, second, third, fourth and fifth samples were compared.

The magnitude relation of MTF is as following.

MTF (second sample) and MTF (fourth sample) are substantially equal. MTF (third sample) and MTF (fifth sample) are substantially equal.

MTF (second sample)≈MTF (fourth sample)>MTF (first sample)>MTF (third sample)≈MTF (fifth sample)

(Experimental Example 8)

The same measurements were made for Al—Si, Al—Si—Cu, and Al—Cu. The content ratios of Si and Cu were the same as in experimental example 4.

Each sample had a bamboo structure as shown in FIG. 9, like the experimental example 7, and the relation between MTF and the sample fabricating method was the same as in experimental example 7.

(Experimental Example 9)

For a tungsten (W) wiring, the relation between the current direction and the crystal axis direction was investigated.

For each crystal W, MTFs for the wirings in the {100}, {111} and {110} orientations were compared. The lattice planes parallel to the wiring surface within each crystal grain were aligned with {100}, {111} and {110} plane, the crystal axes within the {100} plane, the {111} plane and the {110} plane being irregularly rotated, respectively. MTF of the {110} oriented polycrystal was largest.

For a single crystal {110} oriented W wiring, the angle $\theta_6$ made by the [111] direction relative to the current direction formed a different wiring, and MTF was measured. The wirings were formed at intervals of 2.5° when $\theta_6$ was from 0° to 90°. MTF was largest at $\theta_6=0°$, and MTFs were substantially equal when $\theta_6$ was from 0° to 5°.

MTF from $\theta_6=7.5°$ to $\theta_6=17.5°$ was about 90% of an MTF ($\theta_6=0°$). MTF from $\theta_6=20°$ to $\theta_6=90°$ greatly decreased, and MTF from $\theta_6=30°$ to $\theta_6=90°$ was about 50% of an MTF ($\theta_6=0°$).

(Experimental Example 10)

The same measurements as in experimental example 9 were made for Mo. The result was the same as in experimental example 9.

The wiring to which the present invention is applicable is preferably used on a portion through which a large current flows. For example, a common line such as a power source line indicated by 2001 and a ground line indicated by 2021 in FIG. 3. The present invention is more preferably used for all the wirings within a circuit.

As above described, according to the present invention, it is possible to provide a semiconductor circuit device wiring having a structure which allows for the fabrication of wiring superior in migration resistance than the conventional one, and with a better yield.

What is claimed is:

1. A semiconductor circuit device comprising:

a semiconductor body;

an insulating film provided on said body;

a contact hole formed in said insulating film;

a conductor buried in said contact hole; and a wiring provided on both of said conductor and said insulating film;

wherein said wiring comprises a face-centered cubic lattice structure of a single crystal metal having a plane orientation (100), and the crystal axis direction along which nearest neighboring atoms in said single crystal metal are arranged and the electric current direction through said wiring cross each other at an angle of 22.5° or less.

2. A semiconductor circuit device comprising:

a semiconductor body;

an insulating film provided on said body;

a contact hole formed in said insulating film;

a conductor buried in said contact hole; and a wiring on both of said conductor and said insulating film, wherein said wiring comprises polycrystalline metal including a plurality of face-centered cubic lattice structure crystalline grains having a plane orientation (100), and not less than 50% of said crystalline grains have orientation such that the crystal axis direction along which nearest neighboring atoms in each of said crystalline grains constituting said polycrystalline metal are arranged and the electric current direction through said wiring cross each other at an angle of 22.5° or less.

3. A device according to claims 1 or 2 wherein said metal is Al or Cu.

\* \* \* \* \*

UNITED STATES PATENT AND TRADEMARK OFFICE
CERTIFICATE OF CORRECTION

PATENT NO. : 5,602,424
DATED : February 11, 1997
INVENTOR(S) : KAZUO TSUBOUCHI, ET AL.        Page 1 of 3

It is certified that error appears in the above-identified patent and that said Letters Patent is hereby corrected as shown below:

COLUMN 1

Line 60, "is described" should be deleted--; and
Line 61, "microscope." should read
    --microscope is described--.

COLUMN 5

Line 43, "wiling" should read --wiring--.

COLUMN 6

Line 12, "in," should read --in--.

COLUMN 8

Line 55, "tripe" should read --triple--.

COLUMN 9

Line 15, "observation" should read --experiment--;
Line 24, "⓪" should read --①--;
Line 36, "degree," should read --degrees,--;
Line 37, "degree;" should read --degrees;--;
Line 39, "degree," should read --degrees,--;
Line 40, "degree;" should read --degrees;--; and
Line 42, "degree;" should read --degrees;--.

UNITED STATES PATENT AND TRADEMARK OFFICE
CERTIFICATE OF CORRECTION

PATENT NO. : 5,602,424

DATED : February 11, 1997

INVENTOR(S) : KAZUO TSUBOUCHI, ET AL.

Page 2 of 3

It is certified that error appears in the above-identified patent and that said Letters Patent is hereby corrected as shown below:

COLUMN 10

Line 6, "were" should read --was--;
Line 21, "degree," should read --degrees,--;
Line 22, "degree;" should read --degrees;--;
Line 24, "degree," should read --degrees,--;
Line 25, "degree;" should read --degrees;--;
Line 27, "degree;" should read --degrees;--; and
Line 33, "Nothing" should read --Noting--.

COLUMN 11

Line 18, "observation" should read --experiment--;
Line 19, "made" should read --performed--;
Line 23, "observations" should read --experiments--; and
Line 46, "water" should read --wafer--.

COLUMN 12

Line 36, "havihg" should read --having--.

UNITED STATES PATENT AND TRADEMARK OFFICE
CERTIFICATE OF CORRECTION

PATENT NO. : 5,602,424

DATED : February 11, 1997

INVENTOR(S) : KAZUO TSUBOUCHI, ET AL.

Page 3 of 3

It is certified that error appears in the above-identified patent and that said Letters Patent is hereby corrected as shown below:

COLUMN 14

Line 1, "measure" should read --measured--.

Signed and Sealed this

Twenty-sixth Day of August, 1997

Attest:

BRUCE LEHMAN

Attesting Officer

Commissioner of Patents and Trademarks